United States Patent
Hwang et al.

(10) Patent No.: US 7,253,099 B2
(45) Date of Patent: Aug. 7, 2007

(54) METHOD OF MANUFACTURING SEMICONDUCTOR DEVICE THAT INCLUDES FORMING SELF-ALIGNED CONTACT PAD

(75) Inventors: Jae-Hee Hwang, Gyeonggi-do (KR); Jeong-Yun Lee, Gyeonggi-do (KR); Tae-Ryong Kim, Gyeonggi-do (KR); Yong-Hyeon Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 314 days.

(21) Appl. No.: 10/957,305

(22) Filed: Sep. 30, 2004

(65) Prior Publication Data

US 2005/0101127 A1    May 12, 2005

(30) Foreign Application Priority Data

Nov. 8, 2003   (KR) .................... 10-2003-0078897

(51) Int. Cl.
*H01L 21/4763* (2006.01)
(52) U.S. Cl. ................ 438/637; 438/639; 257/E21.577
(58) Field of Classification Search ........ 438/229–230, 438/624, 634, 637–640, 734–735; 257/E21.24, 257/E21.577
See application file for complete search history.

(56) References Cited

U.S. PATENT DOCUMENTS 6,265,296 B1   7/2001 Yen et al.

6,287,957 B1   9/2001 Linliu
6,465,294 B1 * 10/2002 Tsai et al. ................... 438/217

FOREIGN PATENT DOCUMENTS

KR   1997-0057914   11/1997

OTHER PUBLICATIONS

English language abstract of Korean Application No. 1997-0057914.

* cited by examiner

*Primary Examiner*—Thanhha S. Pham
(74) *Attorney, Agent, or Firm*—Marger Johnson & McCollom, P.C.

(57) ABSTRACT

According to some embodiments, a gate electrode structure including a gate electrode stack and a spacer, and source/drain region are formed on a semiconductor substrate. A first interlayer insulating layer having a thickness greater than that of the gate electrode structure is formed on the semiconductor substrate. On the first interlayer insulating layer, an etch inducing and focusing mask extending in a same direction as a length direction of the gate electrode structure and covering the gate electrode structure is formed. A second interlayer insulating layer is formed on the first interlayer insulating layer. A photoresist pattern is formed on the second interlayer insulating layer. The second interlayer insulating layer and the first interlayer insulating layer are sequentially etched using the photoresist pattern as an etch mask, thereby forming a SAC hole. A conductive material is used to fill in the SAC hole to form a SAC pad.

20 Claims, 9 Drawing Sheets

METHOD OF MANUFACTURING SEMICONDUCTOR DEVICE THAT INCLUDES FORMING SELF-ALIGNED CONTACT PAD

CROSS REFERENCE TO RELATED APPLICATIONS

This application claims priority from Korean Patent Application No. 2003-78897, filed on Nov. 8, 2003, in the Korean Intellectual Property Office, the content of which is incorporated by reference in its entirety for all purposes.

BACKGROUND OF THE INVENTION

1. Field of the Invention

This disclosure relates to a method of manufacturing a semiconductor device, and more particularly, to a method of manufacturing a semiconductor device including a process of forming a self-aligned contact pad.

2. Description of the Related Art

Due to the reduction in the design rule of semiconductors, a Self-Aligned Contact (SAC) pad forming process has been added in the contact pad forming process. The SAC pad forming process uses a high etch selectivity between materials, thus securing a sufficient process margin in the exposure process and the etch process in spite of the reduction of the design rule. For instance, when forming an SAC hole in a first interlayer insulating layer of a semiconductor DRAM device, a hard mask is formed on a gate conductive film and a spacer is formed on the sidewall of the gate conductive film. In this case, the hard mask and the spacer are formed of a silicon nitride having a high etch selectivity with respect to the first interlayer insulating layer composed of silicon oxide.

Figure 1:
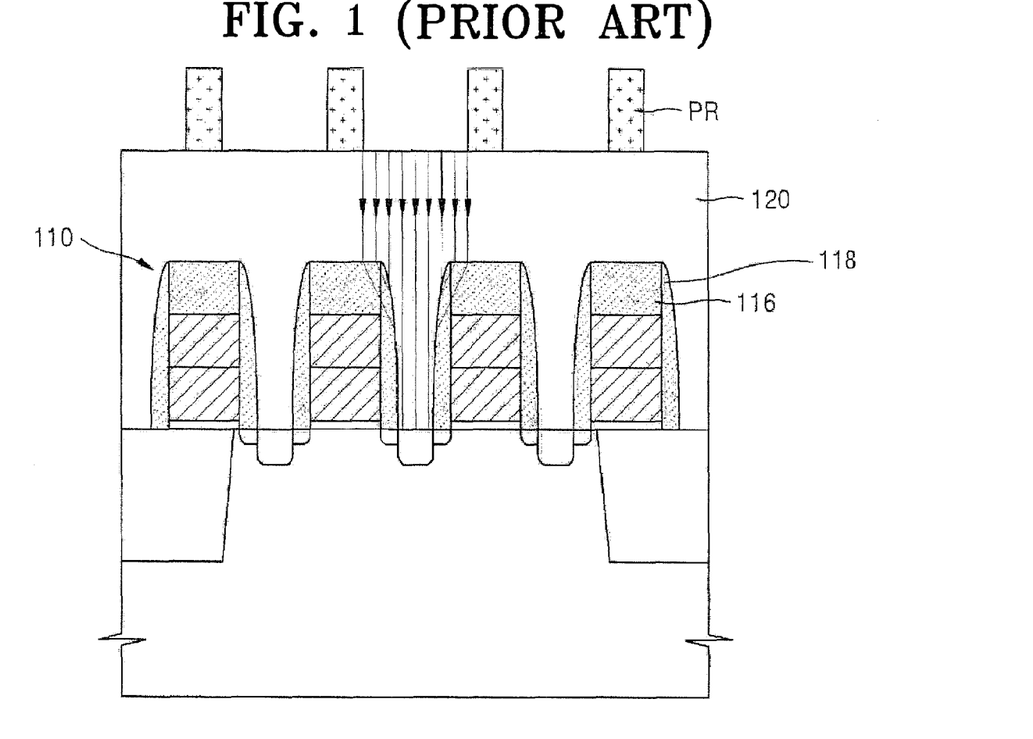
FIG. 1 is a cross-sectional diagram illustrating an etch path in an SAC hole etch process according to the related art.

FIG. 1 is a cross-sectional diagram illustrating an etch path in a self-aligned etch process (hereinafter refererred to as a "SAC hole etch process") according to the related art. As shown by the arrows in FIG. 1, the etching of the first interlayer insulating layer 120 advances in a vertical direction, while the etching of the hard mask 116 of the gate electrode structure 110 advances with a predetermined inclination. As a result, the spacer 118 of the gate electrode structure 110, i.e., the shoulder of the gate electrode structure 110 becomes the weakest region after the etching process. In this specification, the term "shoulder of conductive line structure" or "shoulder" corresponds to a part of the spacer measured before or after the SAC hole etch process, and represents the upper edge of the conductive line structure. Hence, in order to use the self-aligned etch process, the thickness of the shoulder of the gate electrode structure 110, should have at least a predetermined thickness. Since the thickness of the shoulder of the gate electrode structure 110 depends on the thickness of the hard mask 116 and the thickness of the spacer 118, the thickness of the hard mask 116 and the thickness of the spacer 118 should be greater than predetermined values. Moreover, as the thickness of the hard mask 116 increases, an overall height of the gate electrode structure 110 also increases. More specifically, with the increase of the semiconductor device integration, since the critical dimension (CD) of the gate electrode structure 110 is decreased, the aspect ratio of the gate electrode structure 110 is increased.

The increase in the aspect ratio of the gate electrode structure makes it difficult to completely fill the interlayer insulating material between the gate electrode structures. If the gap filling characteristic of the interlayer insulating layer is poor, voids or similar imperfections are generated in the interlayer insulating layer.

Figure 2:
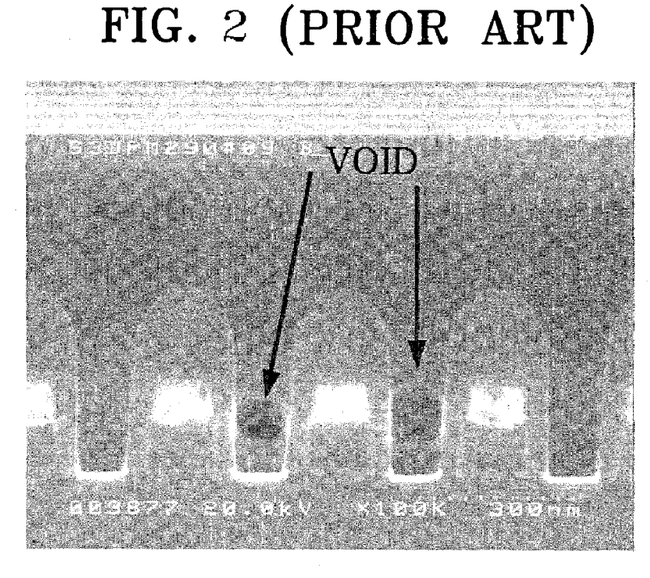
FIG. 2 is a SEM photograph showing voids generated in the first interlayer insulating layer according to the related art.

FIG. 2 is a Scanning Electron Microscope (SEM) photograph showing voids generated in the first interlayer insulating layer between the gate electrode structures. To prevent voids, it is necessary to reduce the height of the gate electrode structure, which is limited.

One method of reducing the height of the gate electrode structure is to reduce the height of the gate conductive film. However, this method cannot be a realistic alternative because it reduces the surface area of the gate conductive film resulting in an increase of the resistance of the gate line.

Another method is to reduce the thickness of the hard mask and the thickness of the spacer. However, this method also has a limitation related to the SAC pad forming process. As aforementioned, to ensure the shoulder of the gate electrode structure has a sufficient thickness after the self-aligned etch process, the thickness of the hard mask and the thickness of the spacer should be thick, and therefore, there is a limitation in reducing the thickness of the hard mask and the thickness of the spacer.

When the design rule is 0.11 μm, etch gases used in the self-aligned etch process can be a combination of $C_5F_8/O_2/Ar$ or a combination of $C_4F_6/O_2/Ar$. If the thickness of the first interlayer insulating layer is greater than 4000 Å, the shoulder thickness of the gate electrode structure should be at least 3500 Å. Then, if the thickness of the hard mask and the thickness of the spacer are increased so as to secure a sufficient shoulder thickness, the space between the gate electrode structures becomes narrow, so that the gap filling characteristics of the first interlayer insulating layer are deteriorated. Accordingly, there is a limitation to increasing the thickness of the shoulder.

Figure 3:
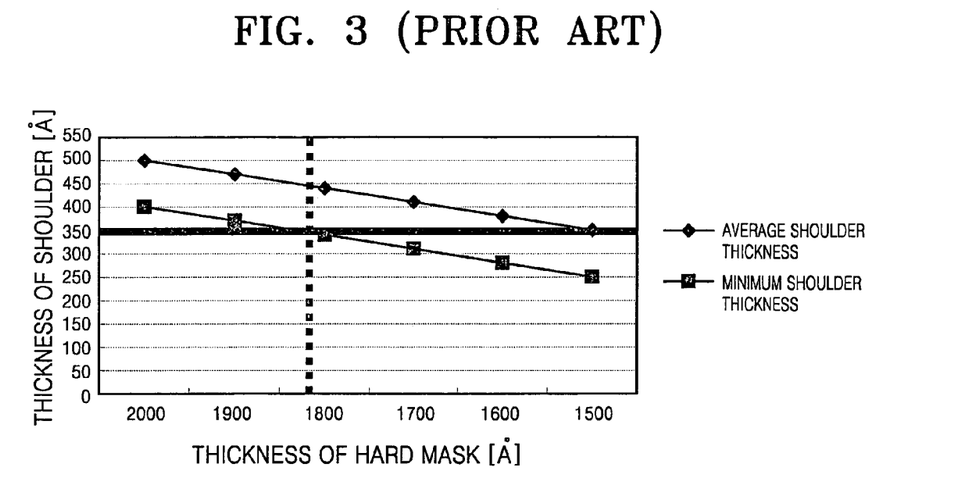
FIG. 3 is a graph illustrating the shoulder thickness of the conductive line structure with respect to the thickness of a hard mask according to the related art.

FIG. 3 is a graph of the shoulder thickness with respect to the thickness of the hard mask. Referring to FIG. 3, if the thickness of the hard mask is decreased by 100 Å, the thickness of the shoulder is decreased by about 30 Å. Thus, to ensure that the shoulder thickness is above 350 Å, the thickness of the hard mask should be above 1800 Å, and should be above 2000 Å for application to mass production. When using the conventional SAC pad forming process, it is not easy to decrease the thickness of the hard mask below 2000 Å, so there is a limitation in reducing the aspect ratio of the gate electrode structure.

As the overall height of the gate electrode structure increases, another problem, i.e., deterioration of the critical dimension (CD) uniformity of the gate electrode structure may occur.

Figure 4:
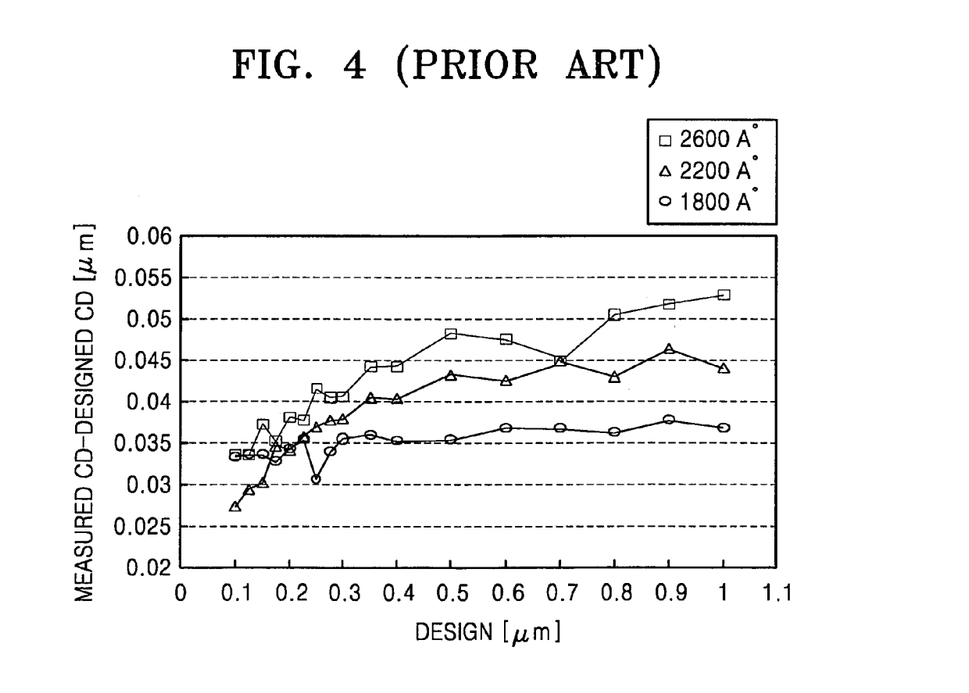
FIG. 4 is a graph illustrating the deviation between a designed CD and a measured CD with respect to the designed CD for various heights of the conductive line structure according to the related art.

FIG. 4 is a graph of a deviation between a design CD and a measured CD after line and space patterns are formed with respect to the designed CD. Referring to FIG. 4, measurements were made when the overall height of the gate electrode structure was 1800 Å, 2200 Å, and 2600 Å. When the design CD is constant and the overall height of the gate electrode structure is increased, it is seen that the deviation between the design CD and the measurement CD is increased. The increase in the deviation between the CDs means that the uniformity of the CD becomes worse with respect to the position of the line as well as on the same line.

If the uniformity of the CD becomes worse, the linearity of the gate electrode structure becomes worse, and it is difficult to obtain a gate electrode structure having a desired shape. If the measurement CD is smaller than the design CD, the refresh characteristics of the DRAM device may be deteriorated. If the measurement CD is larger than the design CD, tRCD failure may occur. Thus, if the CD uniformity is bad, the performance of the transistor may be deteriorated, thereby lowering the reliability of the semiconductor device.

As the design rule decreases and the height of the gate electrode structure increases, another problem, for example, a middle bridge, may occur. In the middle bridge phenomenon, adjacent SAC pads are short-circuited in a length direction of the gate electrode structure when forming the SAC pad. This middle bridge phenomenon occurs because the height of the first interlayer insulating layer to be removed increases but the interval between the SAC pads, specifically the interval between the SAC pads in the length direction of the gate electrode structures, is reduced. Because of a narrow interval between the SAC pads, if the first interlayer insulating layer is overetched in the self-aligned etch process or in a post-etch cleaning process, the SAC holes may connect each other.

A method of forming a SAC pad that attempts to solve this problem is disclosed in U.S. Pat. No. 6,265,296 by Yen et al ("Yen"). In this method, a SAC contact pad is formed using a silicon nitride formed on a blanket insulating layer as a hard mask. That is, a silicon nitride film pattern having an opening partly exposing a source/drain region and a gate electrode structure is formed on the blanket insulating layer, and then a self-aligned etch process of the blanket insulating layer is performed through the opening. Since the silicon nitride film pattern is used as the etch mask instead of a photoresist pattern, the generation of an organic by-product due to a reaction between the photoresist and the etch gas can be prevented or suppressed. As a result, a cleaning process to remove the organic by-product can be omitted or the organic by-product can be completely removed in the cleaning process. However, as described later, if the photoresist pattern is not used as the etch mask, it is difficult to secure a process margin of the SAC hole etch process.

Embodiments of the invention address these and other disadvantages of the conventional art.

SUMMARY OF THE INVENTION

Some embodiments provide a method of manufacturing a semiconductor device including an SAC pad forming process, which facilitates the gap filling by an interlayer insulating layer by lowering the height of the gate electrode structure, improves the CD profile of the gate electrode structure, and enhances CD uniformity of the gate electrode structure.

Some embodiments also provide a method of manufacturing a semiconductor device including an SAC pad forming process, which prevents a short-circuit between the SAC pad and a gate conductive film in spite of a decrease in the thickness of the hard mask and prevents a middle bridge from being generated.

BRIEF DESCRIPTION OF THE DRAWINGS

The above and other features and advantages of the invention will become more apparent by describing in detail exemplary embodiments thereof with reference to the attached drawings that are briefly described below.

DETAILED DESCRIPTION OF THE INVENTION

The invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. Like reference numerals in the drawings denote like elements, and thus their description will be omitted.

FIGS. 5A and 5B through FIG. 9 illustrate a method of manufacturing a semiconductor device including forming a SAC pad according to some embodiments of the invention.

Figure 5A:
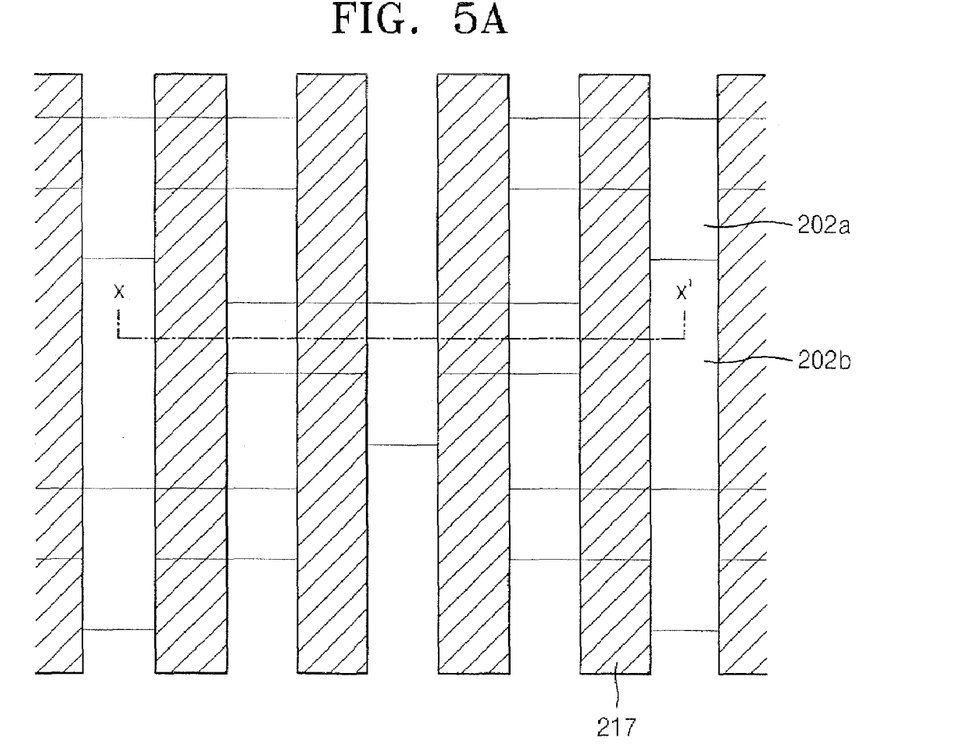
FIG. 5A is a plan diagram illustrating an active region and a gate line stack of a semiconductor device manufactured according to some embodiments of the invention.
Figure 5B:
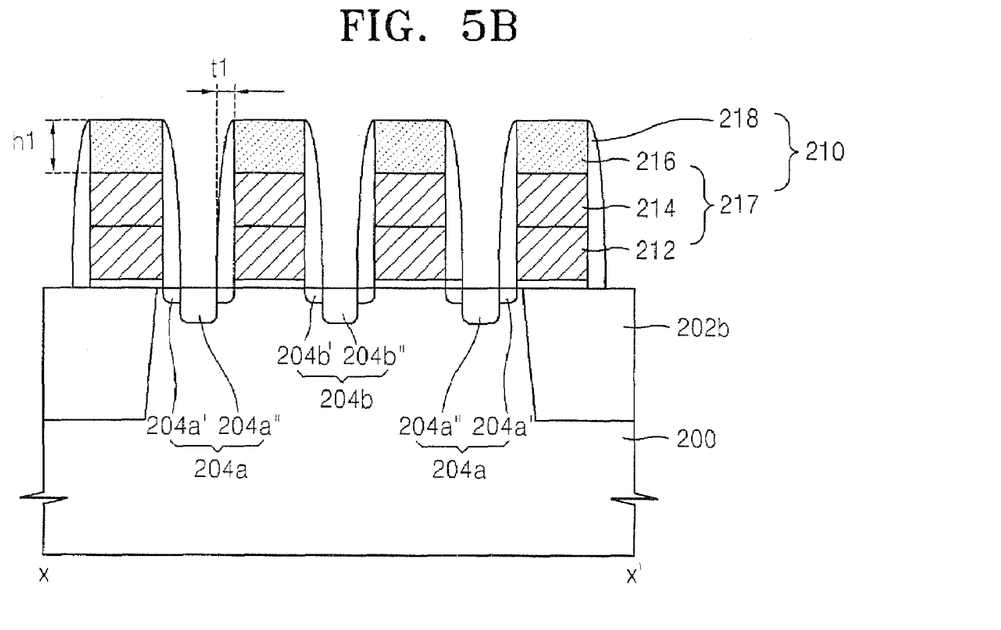
FIG. 5B is a cross-sectional diagram taken along the line X-X' of FIG. 5A.

FIG. 5A is a plan diagram illustrating an active region and a gate line stack of the semiconductor device, and FIG. 5B is a cross-sectional diagram taken along the line X-X' of FIG. 5A.

Referring to FIGS. 5A and 5B, a semiconductor substrate 200 is first prepared. The semiconductor substrate may be, for example, a p-type silicon substrate. Next, a device isolation region 202b, for example, a shallow trench isolation (STI) region, is formed on the semiconductor substrate 200, thereby defining an active region 202a. The STI region may be formed using a trench device isolation method. The active region 202a is T-shaped, as shown in FIG. 5A, and is used for a DRAM device, with two transistors formed in one T-shaped active region.

Next, a gate electrode structure 210 and source and drain regions 204a and 204b are formed. A gate oxide film 212, a gate conductive film 214 and a hard mask 216 are sequentially formed on the semiconductor substrate 200 where the active region is defined, and are then patterned by a photolithography process to form a gate electrode stack 217. The gate oxide film 212 may be a silicon oxide film formed using a thermal oxidation process at a high temperature. The gate conductive film 214 may be an impurity-doped polysilicon film, or a composite film including a polysilicon film and a metal silicide film, or a single metal film. The hard mask 216 is preferably formed of a silicon nitride deposited by a CVD method or the like. According to the present embodiment of the present invention, when the process is performed with the same design rule as that of the related art, the height h1 of the hard mask can be formed lower than that of the related art. This is because a short-circuit is not generated even though the shoulder thickness t1 of the gate electrode structure is formed thin. For example, when the design rule is 0.11 μm, the shoulder thickness may be about 350 Å or less, for example, in a range of about 200 Å to 400 Å. As a result, the height h1 of the hard mask 216 may be in a range of about 500 Å to 1500 Å, and more preferably, in a range of about 500 Å to 1000 Å.

Ions are implanted using the gate electrode stack 217 as a mask to form a lightly doped regions 204a' and 204b' for the source and drain regions 204a and 204b. When the semiconductor substrate 200 is a p-type substrate, arsenic (As) ions or phosphorous (P) ions can be used for the implantation.

A spacer 218 is formed on a sidewall of the gate electrode stack 217. The spacer 218 is formed by depositing an insulating layer along the surfaces of the semiconductor substrate 200 and the gate electrode stack 217 at a uniform thickness and etching back the deposited insulating layer. Like the hard mask 216, the spacer 218 is preferably composed of a silicon nitride. Once the spacer is formed, the gate electrode structure 210 is completed.

Thereafter, ions are implanted into the semiconductor substrate 200 adjacent to the spacer 218 using the gate electrode structure 210 as a mask, thereby forming heavily doped regions 204a" and 204b" for the source and drain regions 204a and 204b. As with forming the lightly doped regions 204a' and 204b', when the semiconductor substrate 200 is a p-type substrate, arsenic ions or phosphorous ions can be used for the implantation.

Although not shown in the drawings, after the heavily doped regions 204a" and 204b' for the source and drain regions 204a and 204b are formed, an insulating layer composed of silicon nitride may be further formed on the gate electrode structure 210. The insulating layer prevents the gate electrode structure from being etched during the SAC hole etching process.

Figure 6:
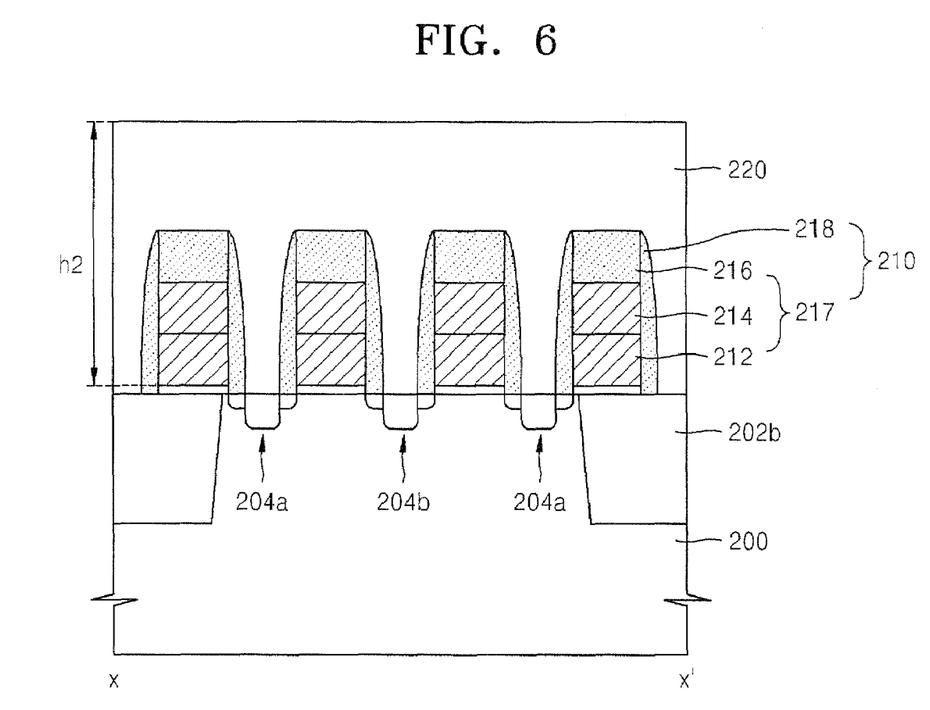
FIG. 6 is a cross-sectional diagram illustrating a semiconductor device manufactured according to some embodiments of the invention after a first interlayer insulating layer is formed.

Referring to FIG. 6, a first interlayer insulating layer 220 is formed on the semiconductor substrate and the gate electrode structure 210. The first interlayer insulating layer 220 may be formed thinner than the first interlayer insulating layer formed according to the related art. For example, in the related art, the height of the first interlayer insulating layer is in a range of 4000 Å, while in case of the present embodiment, the height h2 of the first interlayer insulating layer 220 may be 3000 Å or less. According to the present embodiment, since the height of the gate electrode structure is small, and thus the aspect ratio is small, voids or the like can be prevented from being generated when the first interlayer insulating material is deposited between the gate electrode structures 210. The first interlayer insulating layer 220 is formed of a silicon oxide such as HDP, HTO, MTO, TEOS, or BPSG.

Figure 7A:
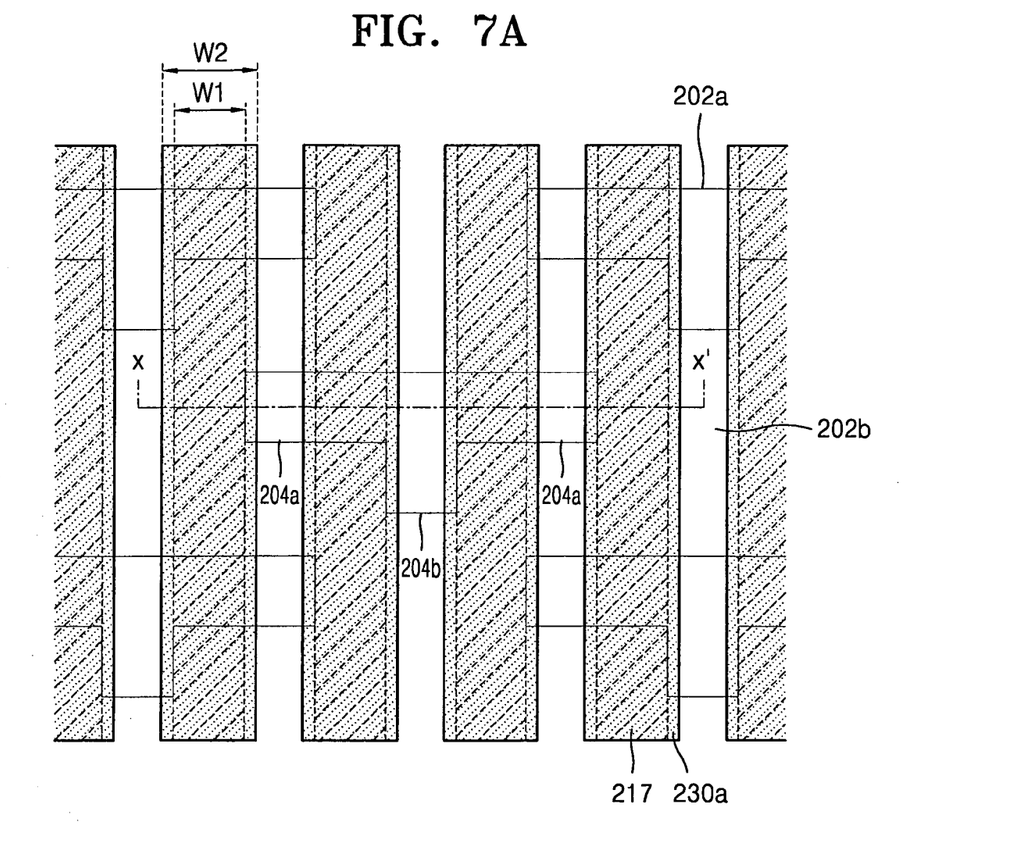
FIG. 7A is a plan diagram illustrating a semiconductor device manufactured according to some embodiments of the invention after an etch inducing and focusing mask is formed.
Figure 7B:
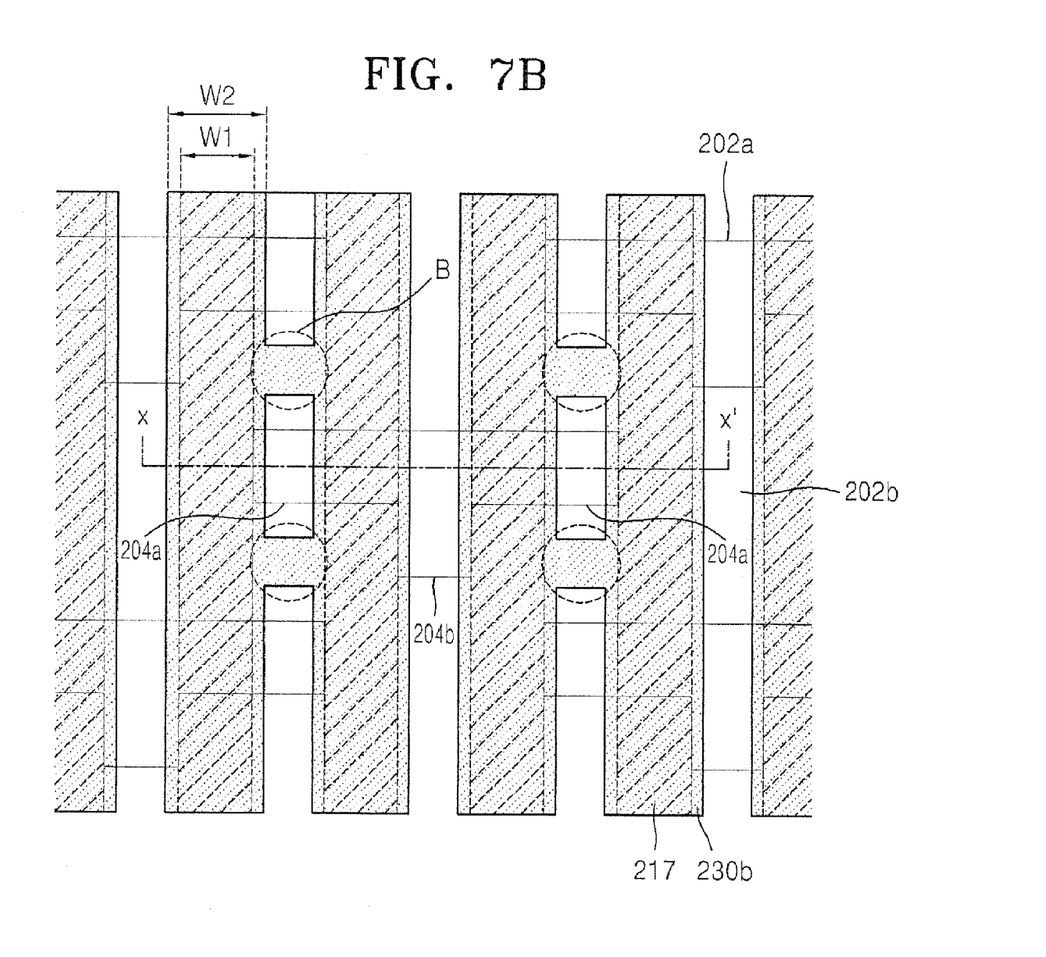
FIG. 7B is a plan diagram illustrating an etch inducing and focusing mask according to other embodiments of the invention.
Figure 7C:
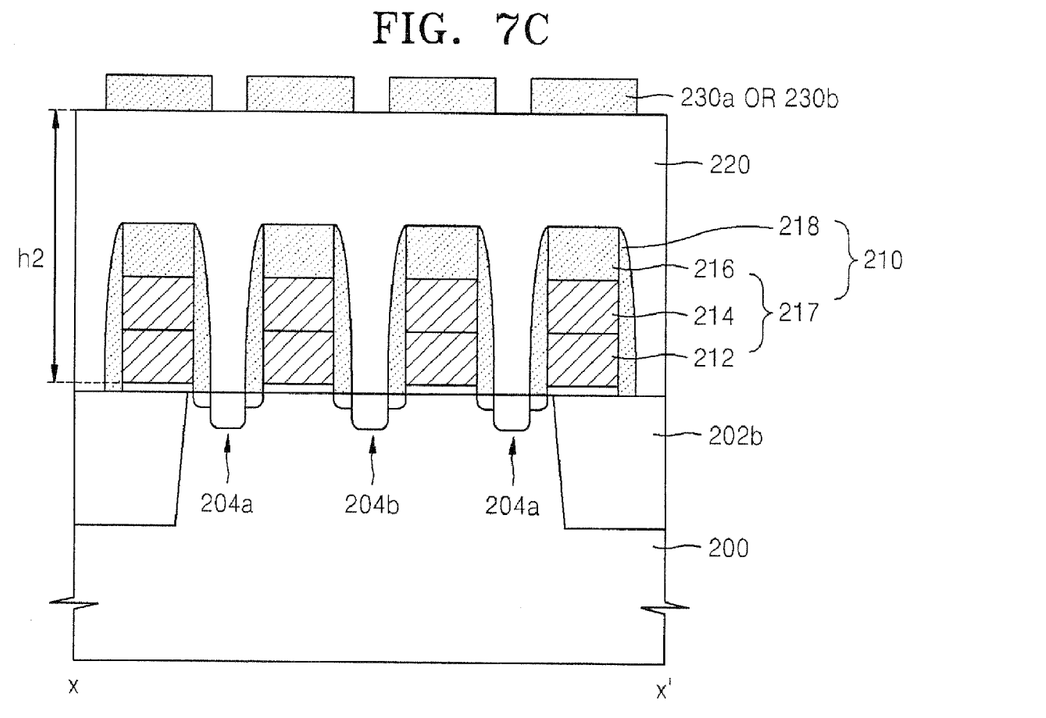
FIG. 7C is a cross-sectional diagram taken along a line X-X' of FIG. 7B.

FIGS. 7A and 7B are plan diagrams illustrating the etch inducing and focusing masks 230a and 230b, respectively. FIG. 7C is a cross-sectional diagram taken along the line X-X' of FIGS. 7A and 7B. Referring to FIGS. 7A and 7C, a silicon nitride film (not shown) is formed on the first interlayer insulating layer 220 and then a photoresist pattern (not shown) is formed thereon. The photoresist pattern is a line type pattern that defines a portion where the focusing mask 230a is to be formed. After anisotropy etching using the photoresist pattern as an etch mask, the remnant photoresist pattern is removed, thus forming the etch inducing and focusing mask 230a.

The etch inducing and focusing mask 230a can be formed over the gate electrode structure 210 so as to cover the gate electrode stack 217, more preferably, to cover the gate electrode structure 210 to protect the gate electrode structure 210 from etching in a subsequent SAC hole etch process. If the etch inducing and focusing mask 230a exactly overlays with the gate electrode stack 217, a width w2 of the etch inducing and focusing mask 230a may be the same as a width w1 of the gate electrode stack 217. However, to consider a possibility of misalignment and to apply the method to mass production, the width w2 of the etch inducing and focusing mask 230a may also be larger than the width w1 of the gate electrode stack 217. For example, the width w2 of the etch inducing and focusing mask 230a may be larger than the width w1 of the gate electrode stack 217, but smaller than a sum of the width w1 of the gate electrode stack 217 and the thickness of the spacer 218.

FIG. 7B is a plan diagram illustrating the etch inducing and focusing mask 230b. Referring to FIG. 7B, the etch inducing and focusing mask 230b further includes a pattern indicated by a dotted circle (B) in addition to the etch inducing and focusing mask 230a of FIG. 7A. The pattern B prevents the middle bridge phenomenon from occurring between the source regions 204a adjacent to each other in a length direction of the gate electrode structure 210. In other words, the etch inducing and focusing mask 230b may further include the middle bridge protecting pattern B.

Figure 8:
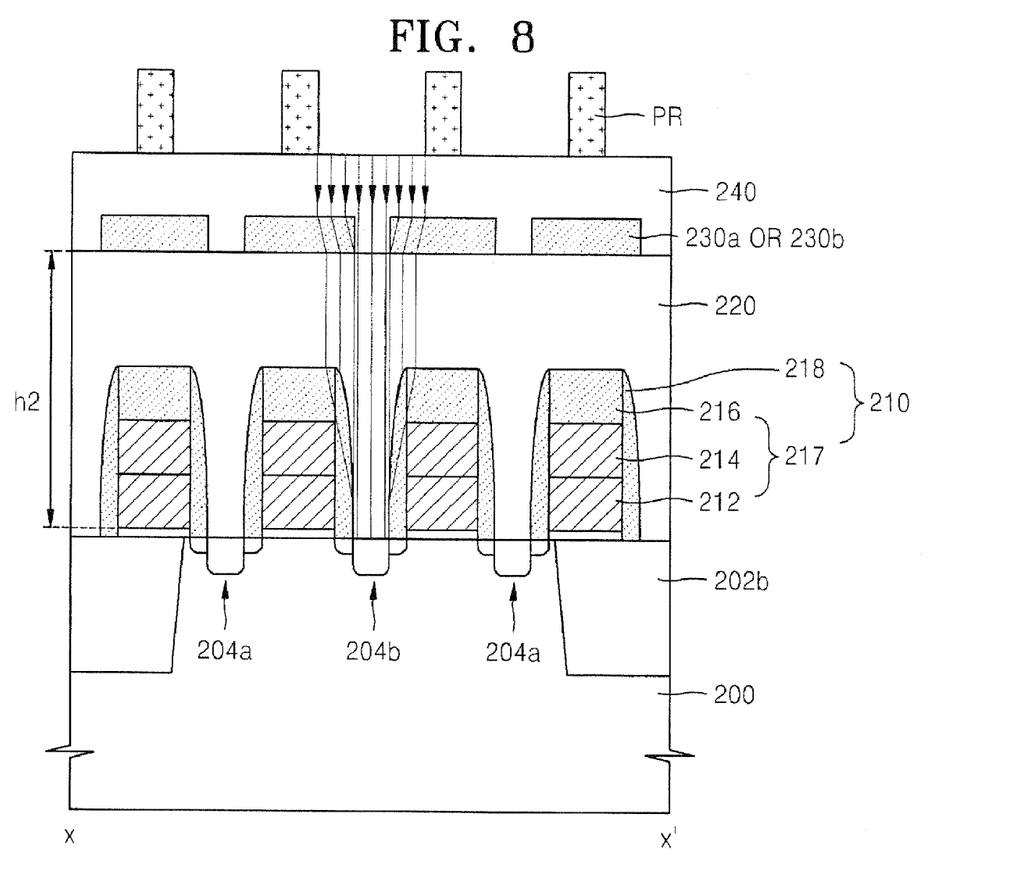
FIG. 8 is a cross-sectional diagram illustrating a semiconductor device manufactured according to some embodiments of the invention after a second interlayer insulating layer and an SAC hole has been etched.

Referring to FIG. 8, a second interlayer insulating layer 240 is formed to a predetermined thickness on the first interlayer insulating layer 220 and the etch inducing and focusing mask 230a or 230b. For instance, the second interlayer insulating layer 240 may be formed such that a total height of the first interlayer insulating layer 220 and the second interlayer insulating layer 240 is equal to or less than the height of the first interlayer insulating layer (see 120 of FIG. 1) formed according to the related art. The second interlayer insulating layer 240 is formed at a thickness that is equal to or greater than the thickness of the etch inducing and focusing mask 230a or 230b, but it may also be formed thinner than the thickness of the etch inducing and focusing mask 230a or 230b. This is because if the thickness of the second interlayer insulating layer 240 is small, an overall thickness of the interlayer insulating layer that is removed in the SAC hole forming step is also small. A photoresist pattern (PR), to be used as an etch mask in the SAC hole etch process, is formed on the second interlayer insulating layer 240. The etch path of the SAC etch process is indicated by arrows in FIG. 8. The etching advances in a vertical direction through the second interlayer insulating layer 240, but the etch path is focused inward by the etch inducing and focusing mask 230a or 230b with a predetermined inclination. As a result, a point where the etch path meets the hard mask 218 is closer to the edge of the hard mask 218 compared with that of the related art. Since the etch path is further focused by the hard mask 218 to a region where the SAC hole is being formed, the etch damage that occurs to the shoulder during the SAC hole etch process is not serious, unlike in the related art. As a result of this SAC hole etch process, a SAC hole (not shown) exposing the source and drain regions 204a and 204b of the semiconductor substrate 200 is formed in the first interlayer insulating layer 220 and the second interlayer insulating layer 240.

Figure 9:
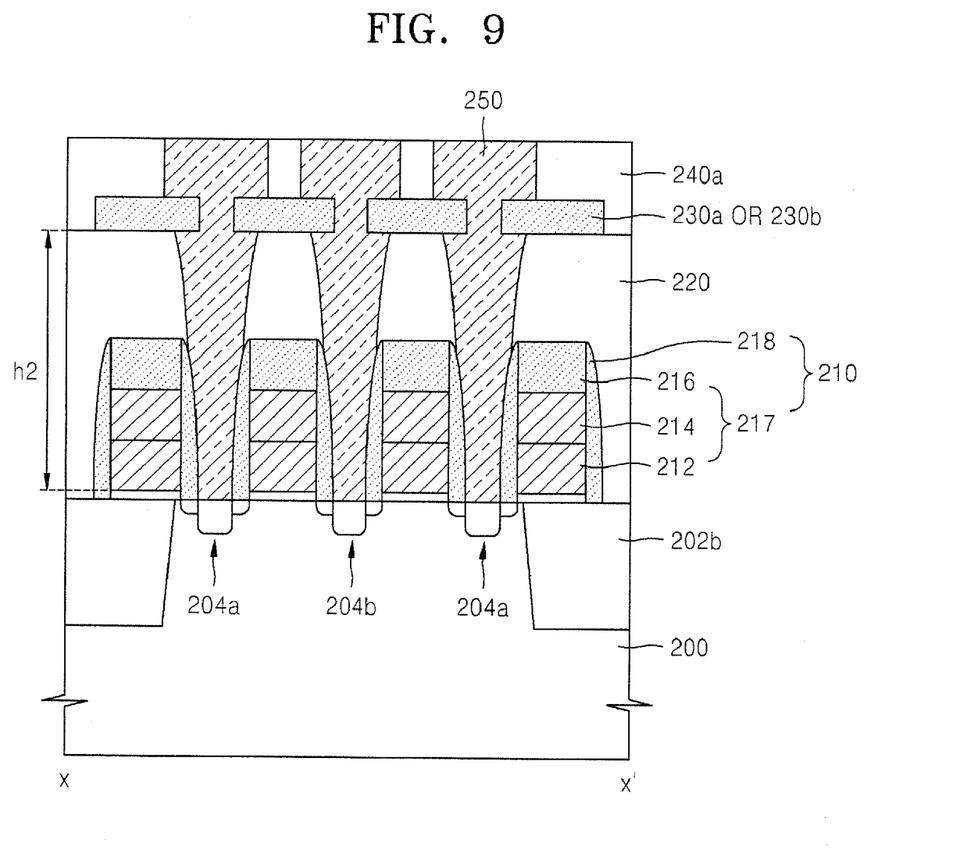
FIG. 9 is a cross-sectional diagram illustrating a semiconductor device manufactured according to some embodiments of the invention after forming an SAC pad.

Referring to FIG. 9, a conductive material is filled in the SAC hole, and then a node is separated by an etchback process, a CMP process, or the like, thus completing the forming of an SAC pad 250. The process of forming the SAC pad 250 uses a general method in this technology field.

According to some embodiments of the invention, the height of the conductive line structure, especially, the height of the gate electrode structure is low because the hard mask is formed with a low height. Hence, when an interlayer insulating material is filled between the conductive line structures, voids or the like can be prevented from being generated. Also, since the CD scattering of the gate electrode structure can be prevented, it is possible to prevent the refresh characteristics from being deteriorated or tRCD failure from being generated due to CD scattering. Further, since the spacer of the gate electrode structure can be manufactured to be thin, the filling characteristics of the first interlayer insulating layer and the SAC pad material are optimum.

Furthermore, since the height of the conductive line structure is low, the entire height of the semiconductor device including the conductive line structure is also low.

Moreover, since the etch inducing and focusing mask can be manufactured so as to further include a middle bridge pattern, the middle bridge phenomenon can be effectively prevented from being generated without adding any semiconductor manufacturing process.

There are many ways to practice the invention. What follows are exemplary, non-limiting descriptions of some embodiments of the invention.

According to some embodiments of the invention, there is provided a method of manufacturing a semiconductor device including a SAC pad forming process. The method includes forming an etch inducing and focusing mask prior to performing a SAC hole etch process. The etch inducing and focusing mask induces an alteration in the etch path when etching an interlayer insulating layer so as to form an SAC hole, thereby relieving or avoiding etching of a spacer portion, which is weak during the SAC hole etch process for a conductive line structure, and concentrating the etching only in the interlayer insulating layer disposed where the SAC hole is being formed. As a result, the etching of the shoulder of the conductive line structure can be much less than that in the related art. Hence, by using the etch inducing and focusing mask, it becomes possible to form a hard mask and/or spacer thinner than the hard mask and/or the spacer of the related art. If the hard mask and the like is made thin, the height of the conductive line structure can be decreased.

According to the above embodiments, the interlayer insulating layer is etched using the photoresist pattern as an etch mask. If the photoresist pattern is used as the etch mask in an etch process, the photoresist pattern reacts with an etchant gas, and an etch by-product containing carbon is generated. This etch by-product is an impurity that should be removed in the cleaning process, but is deposited on the conductive line structure and around the shoulder during the etch process to function as a passivation film for protecting the conductive line structure from the etching. Hence, if the photoresist pattern is used as the etch mask, the hard mask can be formed thin.

Meanwhile, as disclosed in the aforementioned Yen reference, the SAC hole etch process is performed using a hard mask (functionally similar to the etch inducing and focusing mask proposed in the present invention) having an opening as an etch mask. In conclusion, according to Yen, since the photoresist pattern is not used as the etch mask, a passivation by-product is not generated by the photoresist pattern. If the passivation by-product is not generated, the etch selectivity is decreased by at least half, and there is a limit to the reduction of the thickness of the shoulder of the conductive line structure.

The etch inducing and focusing mask is positioned on an upper surface of the conductive line structure, and it is manufactured as a line type pattern so as to cover the conductive line structure. Manufacturing a line type pattern allows the exposure and etch processes to be much easier and simpler than manufacturing a contact type pattern. According to Yen, the hard mask is manufactured with a contact type pattern.

Although a planar shape of the hard mask is not explicitly disclosed by Yen, referring to Yen's claim 1, the opening formed in the hard mask exposes only a predetermined space. Ultimately, it is seen that Yen uses the contact type hard mask. Also, it is inevitable to use the contact type hard mask to prevent the SAC pads from being short-circuited. Unlike Yen, according to embodiments of the invention the photoresist pattern, which is used as the etch mask in the SAC hole etch process, is manufactured with a contact type pattern, and the etch inducing and focusing mask is manufactured with a line type pattern.

In a method of manufacturing a semiconductor device according to other embodiments of the invention, a conductive line structure is first formed on a semiconductor substrate. Then, a first interlayer insulating layer is formed on the semiconductor substrate, the first interlayer insulating layer having a height that is greater than the height of the conductive line structure. Thereafter, an etch inducing and focusing mask is formed on the first interlayer insulating layer, the etch inducing and focusing mask extending in a same direction as a length direction of the conductive line structure and covering the conductive line structure. The etch inducing and focusing mask has a line type pattern having the aforementioned characteristics. Then, a second interlayer insulating layer is formed on the first interlayer insulating layer, the second interlayer insulating layer having a height that is equal to or greater than the height of the etch inducing and focusing mask. A photoresist pattern for forming an SAC hole is formed in the second interlayer insulating layer. Thereafter, the second interlayer insulating layer and the first interlayer insulating layer are sequentially etched using the photoresist pattern as an etch mask to form an SAC hole. A conductive material is filled in the SAC hole to form an SAC pad.

The conductive line structure includes a conductive line stack and a spacer, and the conductive line stack includes a conductive film and a hard mask. As aforementioned, the conductive line stack and the spacer can be manufactured thinner than those of the related art by reducing the height of the hard mask. For example, the hard mask of the conductive line structure may have a height ranging from 500 Å to 1,500 Å. As a result, the hard mask and the spacer after the etch of the SAC hole can be formed to have a thickness ranging from 200 Å to 400 Å

The width of the etch inducing and focusing mask may be equal to or greater than the width of the conductive line stack. Although the width of the etch inducing and focusing mask may be greater than the width of the conductive line stack, it is less than a sum of the width of the conductive line stack and the thickness of the spacer. This is because if the width of the etch inducing and focusing mask is greater than the width of the conductive line stack, even if a misalignment is generated, exposure of the conductive material film due to an overetch around the shoulder of the conductive line structure can be prevented. Therefore, the shoulder of the conductive line structure is formed at a thickness that can be protected when etching the first and second interlayer insulating layers, and the width of the etch inducing and focusing mask is variably adjustable considering the shoulder thickness of the conductive line structure and the height of the first interlayer insulating layer.

The etch inducing and focusing mask may further include a middle bridge protecting pattern. The middle bridge protecting pattern can be interposed between adjacent contacts.

According to another aspect of some embodiments of the invention, there is provided a method of manufacturing a semiconductor device in which a storage node contact pad connected directly to the source and drain regions is formed. First, a semiconductor substrate including an active region and a device isolation region is prepared. A gate electrode stack comprising a gate oxide film, a gate conductive film and a hard mask is formed on the semiconductor substrate. A first impurity region is formed in the semiconductor substrate adjacent to the gate electrode stack. Thereafter, a spacer is formed on a sidewall of the gate electrode stack thereby forming a gate electrode structure comprising the gate electrode stack and the spacer. A second impurity region is formed in the semiconductor substrate adjacent to the spacer, thereby forming a source/drain region with LDD structure. As a result, a transistor is formed. Then, a first interlayer insulating layer is formed on the semiconductor substrate, the first interlayer insulating layer having a height that is greater than the height of an upper surface of the gate electrode structure. Thereafter, an etch inducing and focusing mask is formed on the first interlayer insulating layer, the etch inducing and focusing mask extending in a length direction of the gate electrode structure and covering the gate electrode structure. Thereafter, a second interlayer insulating layer is formed on the first interlayer insulating layer, the second interlayer insulating layer having a height that is equal to or greater than the height of the etch inducing and focusing mask. Next, a photoresist pattern for forming an SAC hole is formed on the second interlayer insulating layer. The second interlayer insulating layer and the first interlayer insulating layer are sequentially etched using the photoresist pattern as an etch mask to form an SAC hole. Then, a conductive material is filled in the SAC hole to form an SAC pad.

The various limitations and modifications according to the first embodiment can be identically applied to the present embodiment. The middle bridge protecting pattern connects the etch inducing and focusing masks adjacent to each other, and may be formed in a space between the drain regions adjacent to each other in a length direction of the gate electrode structure.

Although the specification may refer to "an", "one", "another", or "some" embodiment(s) in several locations, this does not necessarily mean that each such reference is to the same embodiment(s), or that the feature only applies to a single embodiment.

The preceding embodiments are exemplary. Those of skill in the art will recognize that the concepts taught herein can be tailored to a particular application in many other advantageous ways. In particular, those skilled in the art will recognize that the illustrated embodiments are but one of many alternative implementations that will become apparent upon reading this disclosure. Such alternative implementations are encompassed within the embodiments of the invention, and are intended to fall within the scope of the attached claims.

We claim:

1. A method comprising:
    forming a conductive line structure on a semiconductor substrate;
    forming a first interlayer insulating layer on the semiconductor substrate, the first interlayer insulating layer having a thickness greater than that of the conductive line structure;
    forming an etch inducing and focusing mask on the first interlayer insulating layer, the etch inducing and focusing mask extending in the same direction as a length direction of the conductive line structure and covering the conductive line structure;
    forming a second interlayer insulating layer on the first interlayer insulating layer, the second interlayer insulating layer having a thickness that is equal to or greater than a thickness of the etch inducing and focusing mask;
    forming a photoresist pattern on the second interlayer insulating layer;
    etching the second interlayer insulating layer and the first interlayer insulating layer using the photoresist pattern as an etch mask to form a SAC hole, wherein the first interlayer insulating layer and the second interlayer insulating layer are selectively etched with respect to the etch inducing and focusing mask, said SAC hole exposing a portion of the conductive line structure and a portion of the semiconductor substrate adjacent to the conductive line structure; and
    filling a conductive material in the SAC hole to form a SAC pad.

2. The method of claim 1, wherein the conductive line structure comprises a conductive line stack and a sidewall spacer, and the etch inducing and focusing mask has a width that is equal to or greater than a width of the conductive line stack.

3. The method of claim 2, wherein the conductive line stack comprises a conductive film and a hard mask, the hard mask having a thickness ranging from 500 Å to 1,500 Å.

4. The method of claim 2, wherein the etch inducing and focusing mask has a width that is greater than the width of the conductive line stack and is less than a sum of the width of the conductive line stack and a thickness of the sidewall spacer.

5. The method of claim 2, wherein a width of the etch inducing and focusing mask corresponds to a thickness of the shoulder of the conductive line structure and the height of the first interlayer insulating layer.

6. The method of claim 1, wherein a thickness of a shoulder of the conductive line structure ranges from 100 Å to 350 Å.

7. The method of claim 1, wherein the etch inducing and focusing mask is of a material having a high etch selectivity with respect to the first interlayer insulating layer and the second interlayer insulating layer.

8. The method of claim 1, wherein the etch inducing and focusing mask further comprises a middle bridge protecting pattern.

9. The method of claim 1, wherein the second interlayer insulating layer has a thickness less than a thickness of the etch inducing and focusing mask.

10. The method of claim 1, wherein forming the second interlayer insulating layer comprises forming a portion of the second interlayer insulating layer laterally adjacent to a sidewall of the etch inducing and focusing mask.

11. A method comprising:

preparing a semiconductor substrate on which an active region and a device isolation region are defined;

forming a gate electrode stack including a gate oxide film, a gate conductive film, and a hard mask on the semiconductor substrate;

forming a spacer on a sidewall of the gate electrode stack, thereby forming a gate electrode structure comprising the gate electrode stack and the spacer;

forming a source region and a drain region in the semiconductor substrate;

forming a first interlayer insulating layer on the semiconductor substrate, the first interlayer insulating layer having a thickness greater than that of the gate electrode structure;

forming an etch inducing and focusing mask on the first interlayer insulating layer, the etch inducing and focusing mask extending in a length direction of the gate electrode structure and covering the gate electrode stack;

forming a second interlayer insulating layer on the first interlayer insulating layer, the second interlayer insulating layer having a thickness that is equal to or greater than a thickness of the etch inducing and focusing mask;

forming a photoresist pattern on the second interlayer insulating layer;

sequentially etching the second interlayer insulating layer and the first interlayer insulating layer using the photoresist pattern as an etch mask to form a SAC hole exposing a portion of the gate electrode structure and a portion of the semiconductor substrate adjacent to the gate electrode structure, wherein the first interlayer insulating layer and the second interlayer insulating layer are selectively etched with respect to the etch inducing and focusing mask; and filling a conductive material in the SAC hole to form a SAC pad.

12. The method of claim 11, wherein the hard mask has a thickness ranging from 500 Å to 1,500 Å.

13. The method of claim 11, wherein a thickness of a shoulder of the gate electrode structure ranges from 100 Å to 350 Å.

14. The method of claim 11, wherein the etch inducing and focusing mask has a width that is equal to or greater than a width of the gate electrode stack.

15. The method of claim 14, wherein the etch inducing and focusing mask has a width that is greater than the width of the gate electrode stack and is less than a sum of the width of the gate electrode stack and a thickness of the spacer.

16. The method of claim 14, wherein a width of the etch inducing and focusing mask corresponds to a thickness of the shoulder of the gate electrode structure and the thickness of the first interlayer insulating layer.

17. The method of claim 11, wherein the etch inducing and focusing mask is composed of a material having a high etch selectivity with respect to the first interlayer insulating layer and the second interlayer insulating layer.

18. The method of claim 11, wherein the etch inducing and focusing mask further comprises a middle bridge protecting pattern.

19. The method of claim 18, wherein forming the etch inducing and focusing mask includes forming a plurality of etch inducing and focusing masks on the first interlayer insulating layer, wherein the middle bridge protecting pattern connects adjacent etch inducing and focusing masks and is disposed in a space between the source region along a lengthwise direction of the gate electrode structure.

20. A method comprising:

forming a conductive line structure on a semiconductor substrate;

forming a first interlayer insulating layer on the semiconductor substrate, the first interlayer insulating layer having a thickness greater than that of the conductive line structure;

forming an etch inducing and focusing mask on the first interlayer insulating layer, the etch inducing and focusing mask extending in the same direction as a length direction of the conductive line structure and covering the conductive line structure;

forming a second interlayer insulating layer on the first interlayer insulating layer, the second interlayer insulating layer having a thickness that is equal to or greater than a thickness of the etch inducing and focusing mask;

forming a photoresist pattern on the second interlayer insulating layer;

etching the second interlayer insulating layer and the first interlayer insulating layer using the photoresist pattern as an etch mask to form a SAC hole exposing a shoulder of the conductive line structure and a portion of the semiconductor substrate adjacent to the conductive line structure, wherein the first interlayer insulating layer is selectively etched with respect to the etch inducing and focusing mask; and filling a conductive material in the SAC hole to form a SAC pad.

* * * * *